US008719675B1

(12) United States Patent
Cypher

(10) Patent No.: US 8,719,675 B1
(45) Date of Patent: May 6, 2014

(54) ORTHOGONAL CODING FOR DATA STORAGE, ACCESS, AND MAINTENANCE

(75) Inventor: Robert Cypher, Saratoga, CA (US)

(73) Assignee: Google Inc., Mountain View, CA (US)

(*) Notice: Subject to any disclaimer, the term of this patent is extended or adjusted under 35 U.S.C. 154(b) by 847 days.

(21) Appl. No.: 12/880,372

(22) Filed: Sep. 13, 2010

Related U.S. Application Data

(60) Provisional application No. 61/355,261, filed on Jun. 16, 2010.

(51) Int. Cl.
*H03M 13/00* (2006.01)

(52) U.S. Cl.
USPC ............ 714/776; 714/752; 714/755; 714/758

(58) Field of Classification Search
USPC .................................. 714/752, 755, 758, 776
See application file for complete search history.

(56) References Cited

U.S. PATENT DOCUMENTS

| | | | |
|---|---|---|---|
| 6,032,269 A | 2/2000 | Renner | |
| 6,151,641 A | 11/2000 | Herbert | |
| 6,216,247 B1 | 4/2001 | Creta et al. | |
| 6,378,038 B1 | 4/2002 | Richardson et al. | |
| 6,721,317 B2 | 4/2004 | Chong | |
| 7,356,752 B2 | 4/2008 | Hewitt et al. | |
| 7,398,459 B2 | 7/2008 | Park et al. | |
| 7,505,890 B2 | 3/2009 | Kuznetsov et al. | |
| 7,546,484 B2 | 6/2009 | Sen et al. | |
| 7,624,229 B1 | 11/2009 | Longinov | |
| 7,676,730 B2 | 3/2010 | Haugan et al. | |
| 7,739,446 B2 | 6/2010 | Kano | |
| 7,774,681 B2 | 8/2010 | Earhart et al. | |
| 7,831,764 B2 | 11/2010 | Nakajima et al. | |
| 7,861,035 B2 | 12/2010 | Baek et al. | |
| 7,861,052 B2 | 12/2010 | Kawamura et al. | |
| 8,065,555 B2 | 11/2011 | Maiyuran et al. | |
| 8,082,393 B2 | 12/2011 | Galloway et al. | |
| 8,086,783 B2 | 12/2011 | O Connor et al. | |
| 8,090,792 B2 | 1/2012 | Dubnicki et al. | |
| 8,140,753 B2 | 3/2012 | Galloway et al. | |
| 8,145,865 B1 | 3/2012 | Longinov et al. | |
| 8,176,247 B2 | 5/2012 | Galloway et al. | |

(Continued)

OTHER PUBLICATIONS

Wikipedia; Reed Solomon; http://en.wikipedia.org/wiki/Reed_Solomon; last modified Sep. 13, 2006, 14 pages.

(Continued)

*Primary Examiner* — Sam Rizk
(74) *Attorney, Agent, or Firm* — Fish & Richardson P.C.

(57) ABSTRACT

Methods, systems, and apparatus, including computer program products, for orthogonal coding for data storage. In one aspect, a method includes receiving a block of data comprising m rows and n columns of data chunks. For each row in the block of data, (c-n) columns of error-correcting row code chunks are generated using a first linear error-correcting code in systematic form and the particular row's data chunks. For each column in the block of data and for each generated column, particular column and (r-m) error-correcting column code chunks for the particular column are allocated to a distinct group of storage nodes, wherein: the column code chunks are generated using a second linear error-correcting code in systematic form and the particular column's data chunks or row code chunks; m and n are greater than one; and c is greater than n and r is greater than m.

24 Claims, 5 Drawing Sheets

(56) References Cited

U.S. PATENT DOCUMENTS

| | | |
|---|---|---|
| 8,180,954 B2 | 5/2012 | Kilzer et al. |
| 8,213,205 B2 | 7/2012 | Rajan |
| 8,234,539 B2 | 7/2012 | Erez |
| 8,255,761 B1 | 8/2012 | Pi et al. |
| 8,279,755 B2 | 10/2012 | Luby |
| 8,307,258 B2 | 11/2012 | Flynn et al. |
| 8,327,234 B2 | 12/2012 | Earnshaw et al. |
| 8,327,237 B2 | 12/2012 | Buckley et al. |
| 2003/0056068 A1 | 3/2003 | McAllister et al. |
| 2003/0149750 A1 | 8/2003 | Franzenburg |
| 2005/0091234 A1 | 4/2005 | Hsu et al. |
| 2006/0080505 A1 | 4/2006 | Arai et al. |
| 2006/0107173 A1* | 5/2006 | Kondou et al. ............... 714/752 |
| 2009/0006886 A1* | 1/2009 | O'Connor et al. ............... 714/5 |
| 2009/0262839 A1 | 10/2009 | Shelby et al. |
| 2009/0265578 A1 | 10/2009 | Baloun et al. |
| 2010/0037117 A1 | 2/2010 | Pescatore |
| 2010/0217915 A1 | 8/2010 | O Connor et al. |
| 2011/0258161 A1 | 10/2011 | Constantinescu et al. |
| 2012/0036333 A1 | 2/2012 | Lecrone et al. |
| 2012/0042142 A1 | 2/2012 | Garman et al. |
| 2012/0042200 A1 | 2/2012 | Takeuchi et al. |
| 2012/0042201 A1 | 2/2012 | Resnick |
| 2012/0131383 A1 | 5/2012 | Galloway et al. |
| 2012/0246548 A1 | 9/2012 | Buckley et al. |

OTHER PUBLICATIONS

Wikipedia; Reed Solomon; http://en.wikipedia.org/wiki/Reed_Solomon; 14 pages.

Hafner, James; "HoVer Erasure Codes for Disk Arrays;" Proceedings of the 2006 International Conference on Dependable Systems and Networks; pp. 217-226; 2006; 10 pages.

Li, Mingqiang; "GRID Codes: Strip-Based Erasure Codes with High Fault Tolerance for Storage Systems;" ACM Transactions on Storage, vol. 4, No. 4, Article 15, Jan. 2009; 22 pages.

Duminuco, Alessandro; "Hierarchical Codes: How to Make Erasure Codes Attractive for Peer-to-Peer Storage Systems;" Proceedings of the Eighth International Conference on Peer-to-Peer Computing; 2008 (P2P'08), pp. 8-11; 10 pages.

* cited by examiner

ORTHOGONAL CODING FOR DATA STORAGE, ACCESS, AND MAINTENANCE

CROSS-REFERENCE TO RELATED APPLICATIONS

This application claims the benefit under 35 U.S.C. §119 (e) of U.S. patent application No. 61/355,261, entitled "Techniques for Data Storage, Access, and Maintenance," filed Jun. 16, 2010, which is incorporated herein by reference in its entirety.

BACKGROUND

This specification relates to digital data processing and, in particular, data storage, access, and maintenance.

Important data is stored on storage devices that potentially fail. The data can be backed-up and stored redundantly so that the data can be recovered if a storage device fails. Data centers can store large amounts of data. Some data is stored redundantly across multiple data centers so that even if an entire data center fails the data can be recovered.

Data can be stored using error-detecting codes. An error-detecting code adds extra data to the data that enables detection of certain errors in the data. One example of an error-detecting code is a cyclic redundancy check (CRC). CRC codes are used to detect failures on storage devices (e.g., hard disk drives).

Data can also be stored using error-correcting codes. An error-correcting code adds extra data to the data that enables correction of errors in the data. The number of errors that can be corrected is limited by the amount of extra data that is added. Examples of error-correcting codes include Reed-Solomon codes.

SUMMARY

In a first aspect, a computer-implemented method includes the actions of receiving a block of data comprising m rows and n columns of data chunks; for each row in the block of data, generating (c-n) columns of error-correcting row code chunks using a first linear error-correcting code in systematic form and the particular row's data chunks; and for each column in the block of data and for each generated column, allocating the particular column and (r-m) error-correcting column code chunks for the particular column to a distinct group of storage nodes, wherein: the column code chunks are generated using a second linear error-correcting code in systematic form and the particular column's data chunks or row code chunks; m and n are greater than one; and c is greater than n and r is greater than m. Other implementations of this aspect include corresponding systems, apparatus, and computer program products.

Implementations can include any or all of the following features. The first linear error-correcting code is distinct from the second linear error-correcting code. The first linear error-correcting code and the second linear error-correcting code are maximum distance separable (MDS) codes. Each data chunk and each code chunk is stored using an error-detecting code so that damaged chunks can be identified. At each group of storage nodes, each of the allocated data chunks, column code chunks, and row code chunks are stored at a distinct storage node.

A correlation of storage node failures within each group of storage nodes is higher than a correlation of failures between groups of storage nodes. Communication between storage nodes at a group uses fewer resources or has a lower latency than communication between groups of storage nodes. Each group of storage nodes is a data center.

The actions further include identifying a damaged chunk at a first group of storage nodes; determining that the damaged chunk cannot be reconstructed without communicating with other groups of storage nodes; receiving from other groups of storage nodes a sufficient number of healthy data chunks and row code chunks for reconstruction of the damaged chunk; and reconstructing the damaged chunk using the received healthy data chunks and row code chunks.

Receiving from other groups of storage nodes a sufficient number of healthy data chunks and row code chunks for reconstruction of the damaged chunk comprises receiving from other groups of storage nodes all of the healthy data chunks and row code chunks corresponding to the damaged chunk's row. The actions further include reconstructing as many other damaged chunks at the first group of storage nodes as is possible using the column code chunks and any healthy data chunks allocated to the first group of storage nodes.

Receiving from other groups of storage nodes all of the healthy data chunks and row code chunks corresponding to the damaged chunk's row comprises instructing the other groups to reconstruct as many other damaged chunks at those groups as is possible using each group's column code chunks and any healthy data chunks allocated to those groups. Determining that the damaged chunk cannot be reconstructed without communicating with other groups of storage nodes comprises determining that a number of damaged chunks of the r chunks at the first group of storage nodes is greater than r-m.

Particular embodiments of the invention can be implemented to realize one or more of the following advantages. Data can be stored, accessed, and maintained at groups of storage nodes while reducing either communication between groups or total storage space or both. Communication between groups can be reduced when a group (e.g., a "local" group) can be identified that receives more requests for data than other groups. In some cases, reliability can be greatly improved without increasing storage or costs associated with communication between groups.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

FIG. 2A is an illustration of an example block of data and code chunks.

FIG. 2B illustrates an example scenario where multiple chunks of data from the block are damaged.

FIG. 2C illustrates an example scenario where multiple chunks of data from the block are damaged.

DETAILED DESCRIPTION

Figure 1:
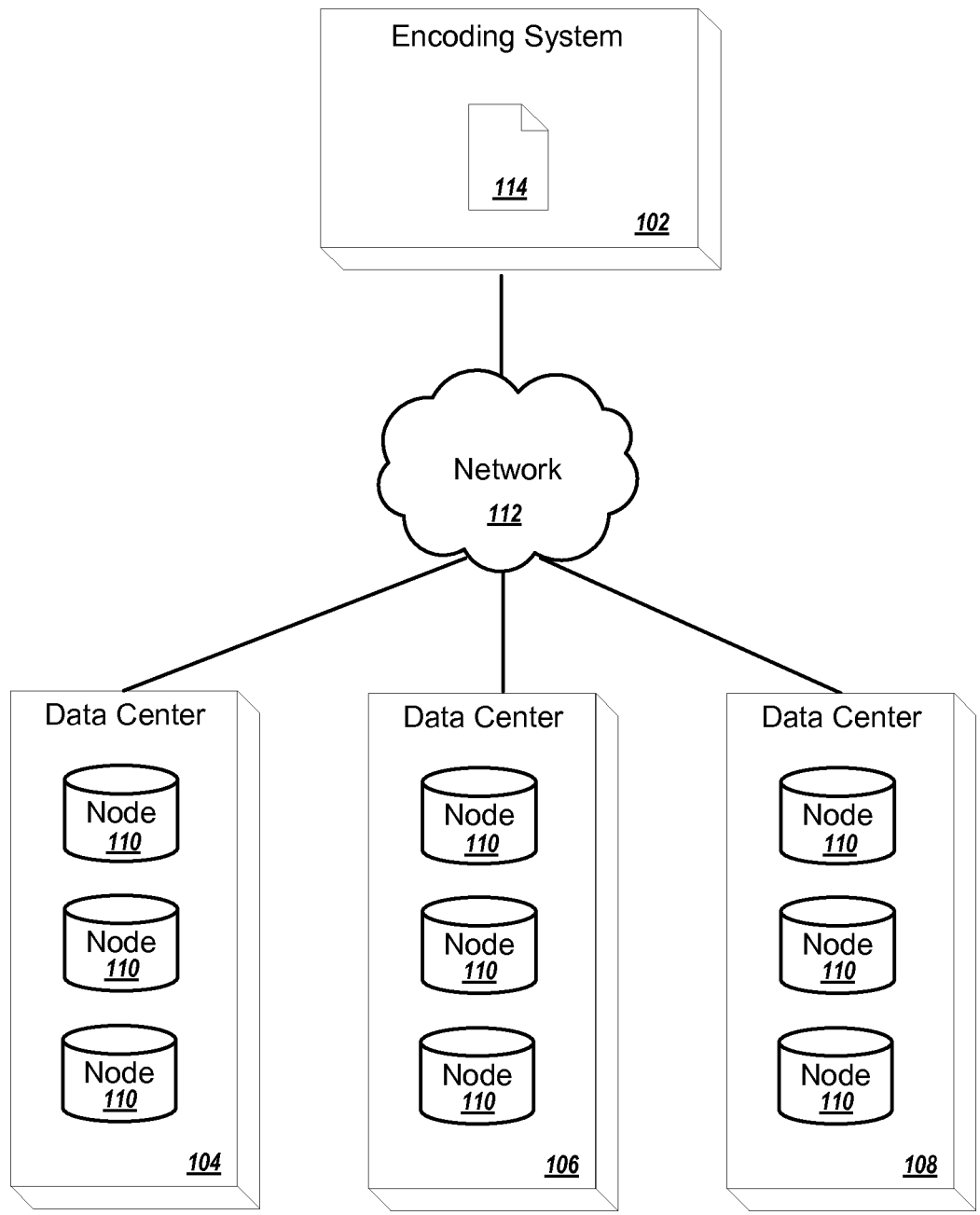
FIG. 1 is a schematic diagram of an encoding system that allocates chunks of data to storage nodes at data centers.

FIG. 1 is a schematic diagram of an encoding system 102 that allocates chunks of data to storage nodes 110 at data centers 104, 106, and 108.

The encoding system 102 comprising one or more data processing apparatuses can store data from a file 114 across storage nodes 110 at the data centers 104, 106, and 108. Redundant copies of the data and error-correcting codes can also be stored at the storage nodes 110. The encoding system communicates with the local data center 104 and the data centers 104, 106, and 108 using a network 112 (e.g., a local area network (LAN), a wide area network (WAN), a cellular network, the Internet, combinations of networks, and the like).

A storage node comprises one or more computer storage mediums. A computer storage medium can be, or be included in, a computer-readable storage device, a computer-readable storage substrate, a random or serial access memory array or device, or a combination of one or more of these. A computer storage medium can also be, or be included in, one or more separate physical components or media (e.g., multiple compact discs, disk drives, or other storage devices). In some implementations, a storage node is a data server, for example, a server including a data processing apparatus and a redundant array of independent disks (RAID) that can divide data among multiple hard disk drives. A group of storage nodes can include a rack, a subnetwork, a data center, or various other collections of servers or storage nodes.

A data center is a group of storage nodes. Typically, a data center is a facility with physical space for computer systems. In some implementations, data centers include telecommunication systems, backup power supplies, climate controls, security, and the like. In FIG. 1, the data centers 104, 106, and 108 are shown with three storage nodes; however, each data center can have more or fewer storage nodes.

Increasing the reliability of stored data involves a trade-off between additional assurances and additional costs. For example, storing additional redundant copies of data requires more storage space at the storage nodes 110. Additional storage space can require, for example, more physical space in a data center, more electricity, more climate control, more money, and so on.

Increasing the reliability of stored data can also involve a trade-off between additional assurances and the time it takes to access or recover data (which can also be considered a cost). For example, communication between storage nodes in a data center is typically less expensive (e.g., faster, or requiring less money, or the like) than communication between data centers. Thus recovery of damaged data takes more time when data centers need to communicate between each other than when data can be recovered at a single data center.

In some implementations, failures of storage nodes within a data center are correlated (e.g., because failures occur when power is lost to the whole data center, a hurricane strikes the data center, or the like), while failures between storage nodes in different data centers are uncorrelated or weakly correlated. Consequently, data is generally stored using techniques that tolerate at least the loss of a single data center (that is, using techniques that can recover data despite an entire data center failing.)

In some implementations, metadata is used at the encoding system 102 or the data centers 104, 106, and 108 or both to keep track of data. For example, the metadata can specify which parts of a file are stored at which data centers, where redundant copies of data are stored, and the like.

Figures 2A, 2B, 2C:
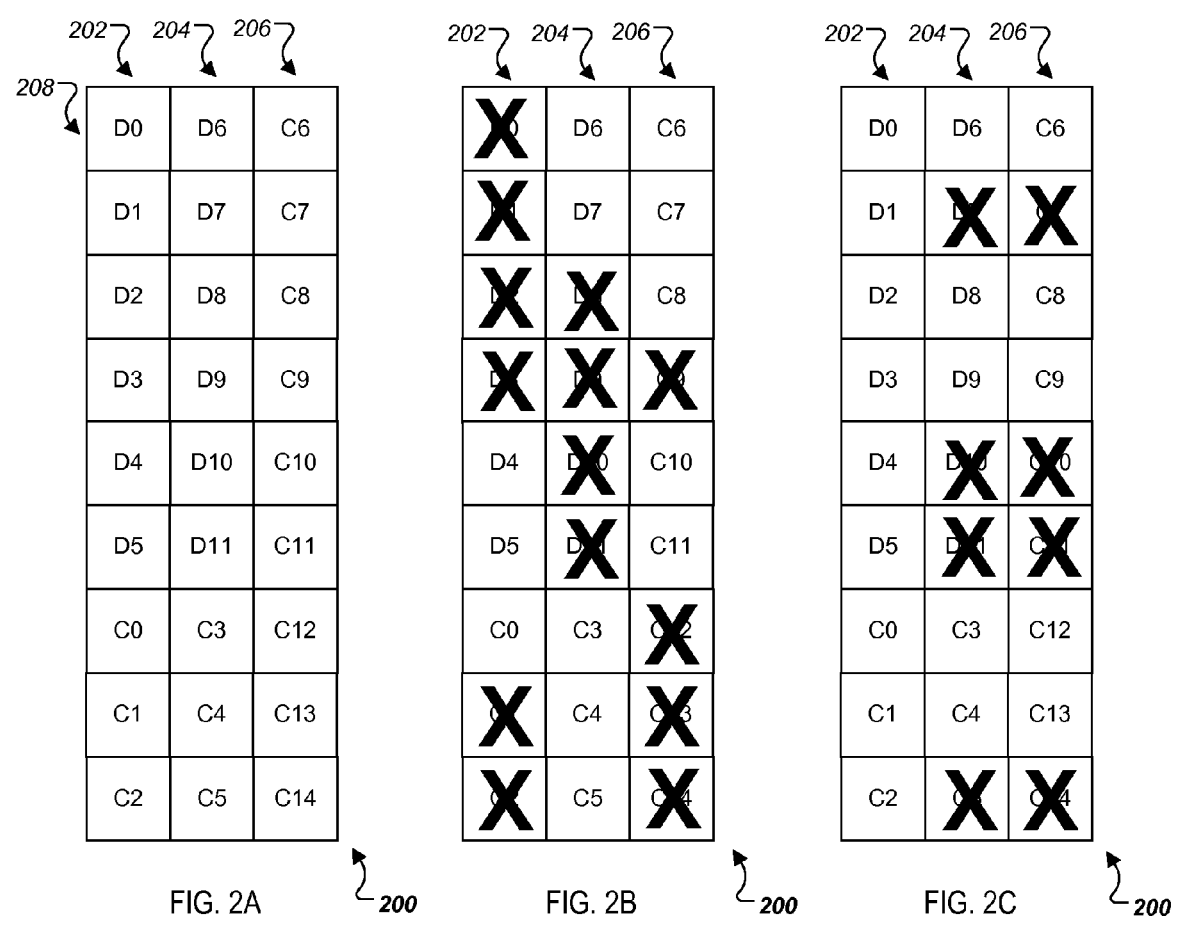

FIG. 2A is an illustration of an example block 200 of data and code chunks. The block 200 is represented as a matrix of m×n chunks. The example block 200 includes a block of 6 rows and 2 columns of data chunks, D0-D11. Error-correcting code chunks C0-C14 were added to the 6×2 block to create the example 9×3 block 200 as shown. In some implementations, the matrix is created from a block of data from a file (e.g. file 114) in column-major order, where successive data symbols are placed in successive rows of the same column until the last row is reached.

A data chunk is a specified amount of data. In some implementations, a data chunk is a contiguous portion of data from a file. In other implementations, a data chunk is one or more non-continuous portions of data from a file. For example, a data chunk can be 256 bytes or other units of data. In FIGS. 2A-C, data chunks are illustrated as squares and labeled with the letter "D" and a number. The number indicates the position of the data chunk in, e.g., a file.

An error-correcting code chunk ("code chunk" hereinafter) comprises a chunk of data based on one or more data chunks. In some implementations, each code chunk is the same specified size (e.g., 256 bytes) as the data chunks. The code chunks are generated using an error-correcting code. In some implementations, generating the code chunks comprises using a maximum distance separable (MDS) code. Examples of MDS codes include Reed-Solomon codes: Various techniques can be used to generate the code chunks. In general, any error-correcting code can be used that can reconstruct d data chunks for any set of d unique, healthy chunks (either data chunks or code chunks).

Generating the code chunks for the block includes using an error-correcting code (the "column code") for chunks in each column and another error-correcting code (the "row code") for chunks in each row. The column code and the row code can be the same code or they can be distinct.

Thus, for the first column 202 of the block 200, code chunks C0-C2 are based on data chunks D0-D5. Because there are three code chunks and six data chunks, the entire column 202 and any chunk within the column 202 can be reconstructed as long as there are six healthy chunks (code chunks or data chunks) available from the column 202. Similarly, code chunks C3-05 are based on data chunks D6-D11.

Code chunks C6-C11 are based on the data chunks in their respective rows. For example, for the first row 208, C6 is based on D0 and D6. If any chunk within the row 208 is damaged, it can be reconstructed if the other two chunks are healthy.

Code chunks C12-C14 can be generated using either their respective rows or columns. Thus, C12 can be generated using C0 and C3 (after those code chunks are generated using the data chunks in their columns), or C6-C11 (after those code chunks are generated using the data chunks in their rows). If the row code and the column code are linear codes, the code chunks will be the same regardless of whether the column code chunks are generated first or the row code chunks are generated first.

Figure 3:
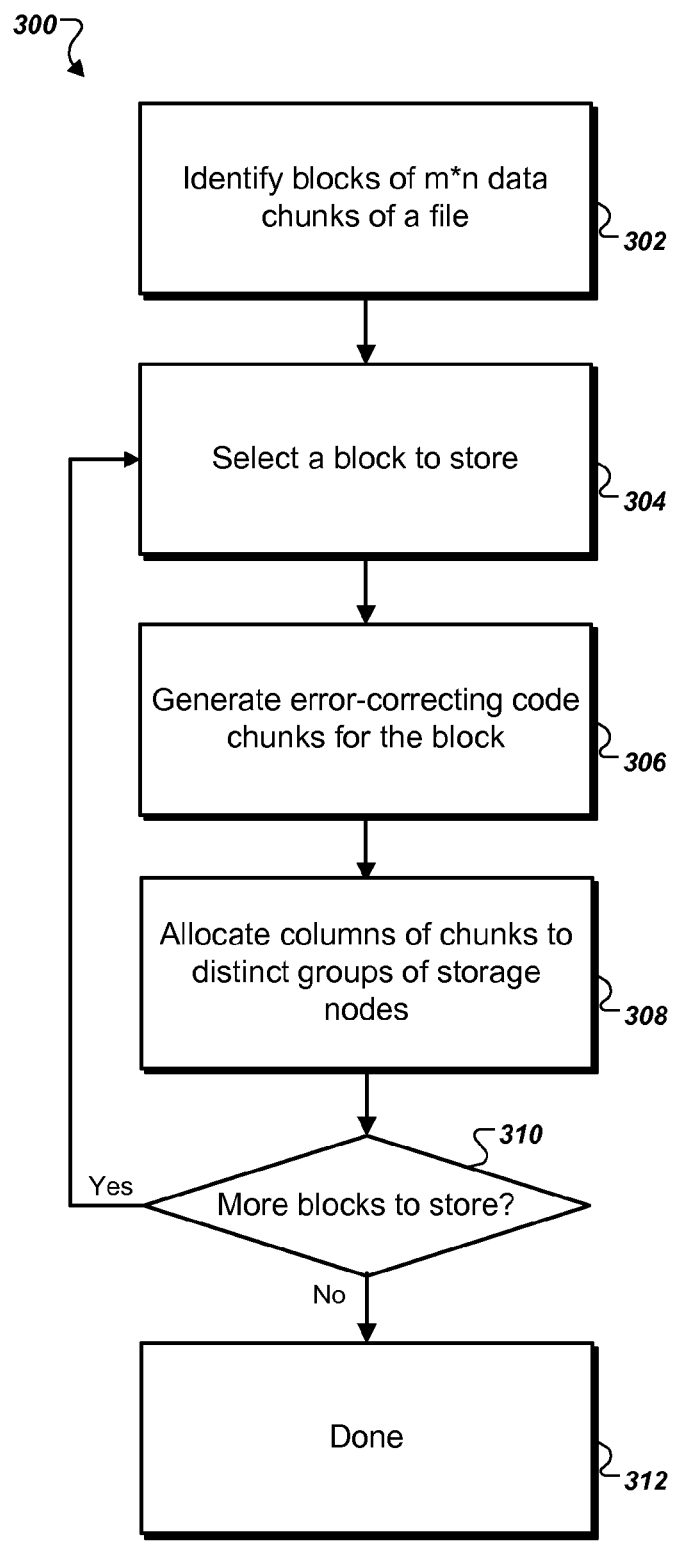
FIG. 3 is a flow diagram of an example technique for storing data at groups of storage nodes.

The block can be stored by allocating each column to a distinct group of storage nodes. For example, referring back to FIG. 1, the first column 202 of chunks can be allocated to the first data center 104, and each chunk of the column 202 can be allocated to a distinct storage node 110 of that data center 104. The second column 204 can be allocated to the second data center 106 and the third column 206 can be allocated to the third data center 106. FIG. 3 below shows a flow diagram of a technique for allocating data and code chunks in this manner.

Figure 4:
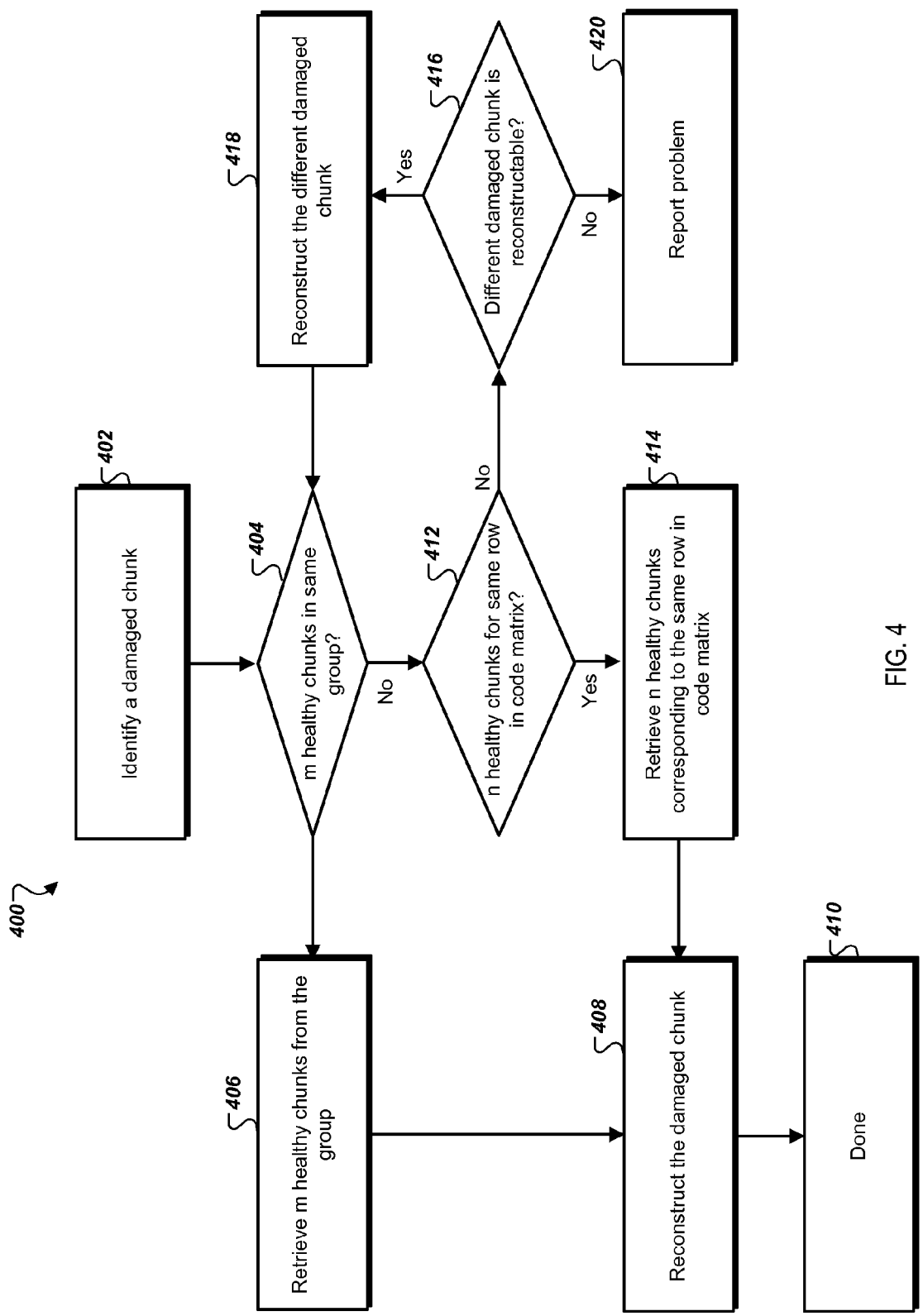
FIG. 4 is a flow diagram of an example technique for data access and maintenance.

When chunks are damaged, the column code is used first to reconstruct chunks within a group. If there are not enough healthy chunks available within a group, the row code is used, perhaps iteratively with the column code (depending on whether iterations are needed), to reconstruct the damaged chunks. FIGS. 2B and 2C illustrate example scenarios where chunks are damaged, and FIG. 4 shows a flow diagram of a technique that can be used for reconstructing a damaged chunk.

FIG. 2B illustrates an example scenario where multiple chunks of data from the block 200 are damaged.

A damaged chunk is a chunk containing one or more errors. Typically, a damaged chunk is identified using an error-detecting code. For example, a damaged chunk can be completely erased (e.g., if the chunk was stored in a hard drive destroyed in a hurricane), or a damaged chunk can have a single bit flipped. A healthy chunk is a chunk that is not damaged.

To reconstruct the damaged chunks, the column code is used first to reconstruct whatever damaged chunks are possible to reconstruct within a column. The column code is typically used first because the chunks in a column are at the same group of storage nodes. In FIG. 2B, all of the chunks in a column can be reconstructed if there are six healthy chunks in the column. However, in the example scenario illustrated, no column has six healthy chunks.

The row code is then used to reconstruct damaged chunks within rows. In some implementations, all of the chunks that can be reconstructed using the row code are reconstructed before iterating with the column code. In some other implementations, only some chunks are reconstructed using the row code before performing reconstruction using the column code again. For example, the row code can be to reconstruct the minimum number of healthy chunks needed in a column to reconstruct the column. For purposes of illustration, FIG. 2B will be discussed as though all of the chunks that can be reconstructed using the row code are actually reconstructed.

Rows with only one damaged chunk can be reconstructed. Thus, D0, D1, D10, D11, and C12 are reconstructed using the row code. After those reconstructions, the second column 204 and the third column 206 have enough healthy chunks that the column code is used to reconstruct the remaining damaged chunks in those columns. Thus, D8 and D9 are reconstructed using the column code on the second column 204, and C9, C13, and C14 are reconstructed using the column code on the third column 206. The first column 202 still lacks enough healthy chunks for reconstruction using the column code, but the row code can be used to reconstruct the damaged chunks. For example, the row code can be used to reconstruct all of the damaged chunks, or the row code can be used to reconstruct three of the damaged chunks and then the column code can be used to reconstruct the remaining damaged chunks.

FIG. 2C illustrates an example scenario where multiple chunks of data from the block 200 are damaged. In this example scenario, none of the damaged chunks can be reconstructed without additional information. The second column 204 and the third column 206 lack enough healthy chunks for reconstruction using the column code, and each row having damaged chunks lacks enough healthy chunks for reconstruction using the row code.

FIG. 3 is a flow diagram of an example technique 300 for storing data at groups of storage nodes. In some implementations, the technique 300 is performed by a system, for example, encoding system 102, or a system in a data center, or the like. For purposes of illustration, the technique 300 will be described with respect to a system that performs the technique 300.

The system identifies blocks of m*n data chunks of a file (step 302). Typically, the system receives the file or parts of the file with a request to store the data chunks. The system selects a block to store (304).

The system generates code chunks using the data chunks (step 306). In some implementations, a first system (e.g., encoding system 102) generates row code chunks, and a second system at a group of storage nodes generates column code chunks for a column allocated to that group. In some other implementations, a first system generates the row and column code chunks and sends the code chunks to allocated groups of storage nodes.

For each of m rows of n data chunks, the system generates (c-n) row code chunks using a first linear error-correcting code in systematic form and the n data chunks. For each of n columns of m data chunks and (c-n) columns of m row code chunks, (r-m) column code chunks are generated using a second linear error-correcting code in systematic form and the m data chunks or m row chunks (either by the system or by another system, e.g., at a group of storage nodes).

The system allocates each column of chunks to a distinct group of storage nodes (step 308). For example, referring to FIG. 1 and the block 200 of FIG. 2 having three columns of chunks, the first column 202 can be allocated to the first data center 104, the second column 204 can be allocated to the second data center 106, and the third column 206 can be allocated to the third data center 108. In some implementations, each chunk is stored at a distinct storage node of the group of storage nodes. In various implementations, each chunk is stored using an error-detecting code so that damaged chunks can be identified. For example, each chunk can be stored with a CRC.

In some implementations, for example where the technique 300 is performed by an encoding system (e.g., encoding system 102), allocating data or code chunks includes sending those chunks to the group of storage nodes that is allocated the chunks. For example, the encoding system can generate all of the code chunks, and then send each allocated code chunk to its allocated group of storage nodes.

In some other implementations, each group of storage nodes generates its allocated code chunks after receiving the data chunks. For example, the data chunks or row code chunks can be sent to each of the groups of storage nodes. Then each group of storage nodes can generate its allocated code chunks. These implementations are useful, for instance, where remote communication is expensive The system determines whether there are more blocks to store (step 310). For example, if there are more blocks in the file, the system stores those blocks by repeating steps 304-308. When the system is done (step 312), all of the blocks of data are stored across groups of storage nodes.

The following discussion mathematically formalizes a technique for generation of the code chunks in some implementations. $M_{x,y}$ denotes the matrix M which has x rows and y columns, $m_{x,y}$ denotes the element in row x and column y of M, $I_{x,x}$ denotes the identity matrix I which has x rows and x columns, an x denotes matrix multiplication, horizontal lines -------- denote vertical composition of two submatrices, and vertical lines | to denote horizontal composition of two submatrices. The elements of all matrices and vectors come from some given Galois Field. A field is an algebraic structure of elements satisfying certain axioms and having notions of certain operations, and a Galois field is a field having finitely many elements.

A block comprises m by n chunks, where each chunk consists of s symbols from the given Galois Field. Each block is conceptually broken into s "planes", where each plane consists of an m×n array of symbols, one from each chunk. Next, each plane is viewed as forming a data matrix $D_{m,n}$. Then, for each plane the data matrix $D_{m,n}$ is encoded using an orthogonal code to create the code matrix $C_{r,c}$ (the details of this encoding are described below). The encoded data $C_{r,c}$ from each plane is stored with separate elements of $C_{r,c}$ being stored in separate nodes, with the elements within a column of Cr,c being mapped to nodes within a group, and with elements from different columns of Cr,c being mapped to nodes in different groups. Finally, within each node a checksum is calculated for the chunk of the elements for the given block that are stored in that node (these elements come from the code matrices Cr,c calculated from the different planes within the block, and thus they may be data chunks or they may be code chunks).

The code matrices Cr,c are created based on an orthogonal combination of two underlying linear codes (over an arbitrary Galois Field), called the column code and the row code. Both of the underlying codes are expressed in systematic form (the code words include the original data to be encoded followed by code symbols).

The column code will be viewed as consisting of column vectors of length r, each of which is obtained from data that is a column vector of length m, where m<r. The column code can be represented by its generator matrix Ar,m where data vectors are left-multiplied by Ar,m to produce code vectors and where $$Ar, m = \frac{Im, m}{A'r - m, m}$$

(that is, the top m rows of Ar,m form the identity matrix Im,m and the bottom r-m rows of Ar,m will be denoted A'r-m,m).

The row code will be viewed as consisting of row vectors of length c, each of which is obtained from data which is a row vector of length n, where n<c. The row code can be represented by its generator matrix Bn,c where data vectors are right multiplied by Bn,c to produce code vectors and where Bn,c=In,n|B'n,c-n (that is, the leftmost n columns of Bn,c form the identity matrix In,n and the rightmost c-n columns of Bn,c will be denoted B'n,c-n). Given a data matrix Dm,n, the corresponding code matrix Cr,c is produced by left-multiplying by matrix Ar,m and right-multiplying by matrix Bn,c as follows:

Ar,m×Dm,n×Bn,c=Cr,c

Where $$Ar, m = \frac{Im, m}{A'r - m, m}$$

And

Bn,c=In,n|B'n,c-n so $$Ar, m \times Dm, n \times Bn, c = \frac{Im, m}{A'r - m, m} \times Dm,$$

$$n \times In, n|B'n, c-n = \frac{Dm, n|Em, c-n}{Fr-m, n|Gr-m, c-n} = Cr, c$$

(that is, the resulting code matrix can be decomposed into submatrices Dm,n, Em,c-n, Fr-m,n, and Gr-m,c-n where the upper-left submatrix Dm,n equals the original data matrix).

Note that $ex, y = : \sum_{j=0}^{n-1} (d_{x,j})(b'_{j,y})$ $$f_{x,y} = \sum_{i=0}^{m-1} (a'_{x,i})(d_{i,y}),$$

and $$g_{x,y} = \sum_{i=0}^{m-1} (a'_{x,i})(e_{i,y}) = \sum_{i=0}^{m-1} (a'_{x,i}) \sum_{j=0}^{n-1} (d_{i,j})(b'_{j,y}) = \sum_{i=0}^{m-1} \sum_{j=0}^{n-1} (a'_{x,i})(d_{i,j})(b'_{j,y}) =$$

$$\sum_{j=0}^{n-1} \sum_{i=0}^{m-1} (a'_{x,i})(d_{i,j})(b'_{j,y}) = \sum_{j=0}^{n-1} \left[ \sum_{i=0}^{m-1} (a'_{x,i})(d_{i,j}) \right] (b'_{j,y}) = \sum_{j=0}^{n-1} (f_{x,j})(b'_{j,y}).$$

Therefore, we have $$\frac{Dm, n}{Fr-m, n} \times B'n, c-n = \frac{Em, c-n}{Gr-m, c-n},$$

so the rightmost c-n columns of Cr,c can be obtained by right-multiplying the leftmost n columns of Cr,c by B'n,c-n.

Also, A'r-m,m×Dm,n|Em,c-n=Fr-m,n|Gr-m,c-n, so the bottom r-m rows of Cr,c can be obtained by left-multiplying the top m rows of Cr,c by A'r-m,m.

FIG. 4 is a flow diagram of an example technique 400 for data access and maintenance. In some implementations, the technique 400 is performed by a system, e.g., encoding system 102, or a system at a data center. For purposes of illustration, the technique 400 will be described with respect to a system. The technique 400 assumes that blocks of data have been stored across groups of storage nodes with row code chunks and column code chunks in accordance with the technique 300 illustrated in FIG. 3.

The system identifies a damaged chunk (step 402). The damaged chunk is stored at a first storage node of a first group of storage nodes. In some implementations, identifying the damaged chunk of data includes using an error-detecting code.

In some cases, the system identifies the damaged chunk when the system receives a request for the damaged chunk. In some other cases, the system identifies the damaged chunk while periodically polling the storage nodes of the first group of storage nodes to determine whether any storage nodes are damaged. In some other cases, the system identifies the damaged chunk after receiving notification of a problem, for example, a power failure, a hard drive failure, a memory error, or the like.

The system determines whether there are m healthy chunks (either data or code chunks) in the first group of storage nodes (step 404). If so, then the system can reconstruct the entire column stored at the first group of storage nodes without communicating with other groups of storage nodes. The system retrieves m healthy chunks from the group (step 406) and reconstructs the damaged chunk (step 408) using the column code. The system is then finished reconstructing the damaged chunk (step 410) and can repeat the technique for any other damaged chunks.

If m healthy chunks are not available at the first group, then the system determines whether n healthy chunks (data or code chunks) are available from other groups of storage nodes for the damaged chunk's row (step 412). Typically, the system polls the other groups that were allocated the chunks for the damaged chunk's row to determine how many healthy chunks are available. In some implementations, for example where the system is a system at a data center, the system sends a request to an encoding system (e.g., encoding system 102) that in response polls the other groups allocated the chunks for the damaged chunk's row.

If n healthy chunks for the same row are available, the system can reconstruct the entire row by retrieving the n chunks. The system retrieves the n chunks (step 414) and reconstructs the damaged chunk using the row code (step 408). The system is then finished reconstructing the damaged chunk (step 410) and can repeat the technique for any other damaged chunks.

If n healthy chunks for the same row are not available, then the system attempts to reconstruct other damaged chunks for the damaged chunk's block. The system determines whether a different damaged chunk is reconstructable (step 416). For example, the system determines whether the different damaged chunk is in a column that has m healthy chunks or a row that has n healthy chunks. If a different damaged chunk is reconstructable, then the system reconstructs the different damaged chunk (step 418). The system uses the column code or the row code to reconstruct the damaged chunk, depending on whether m healthy chunks are available for the different damaged chunk's column or whether n healthy chunks are available for the different damaged chunk's row. In some cases, the system iteratively reconstructs different damaged chunks, alternating between using the row code and the column code as is needed.

If no other damaged chunk is reconstructable, the system reports a problem (step 420). The system needs additional information to reconstruct the damaged chunk. For example, the system makes an entry into an error log or notifies a system operator.

Figure 5:
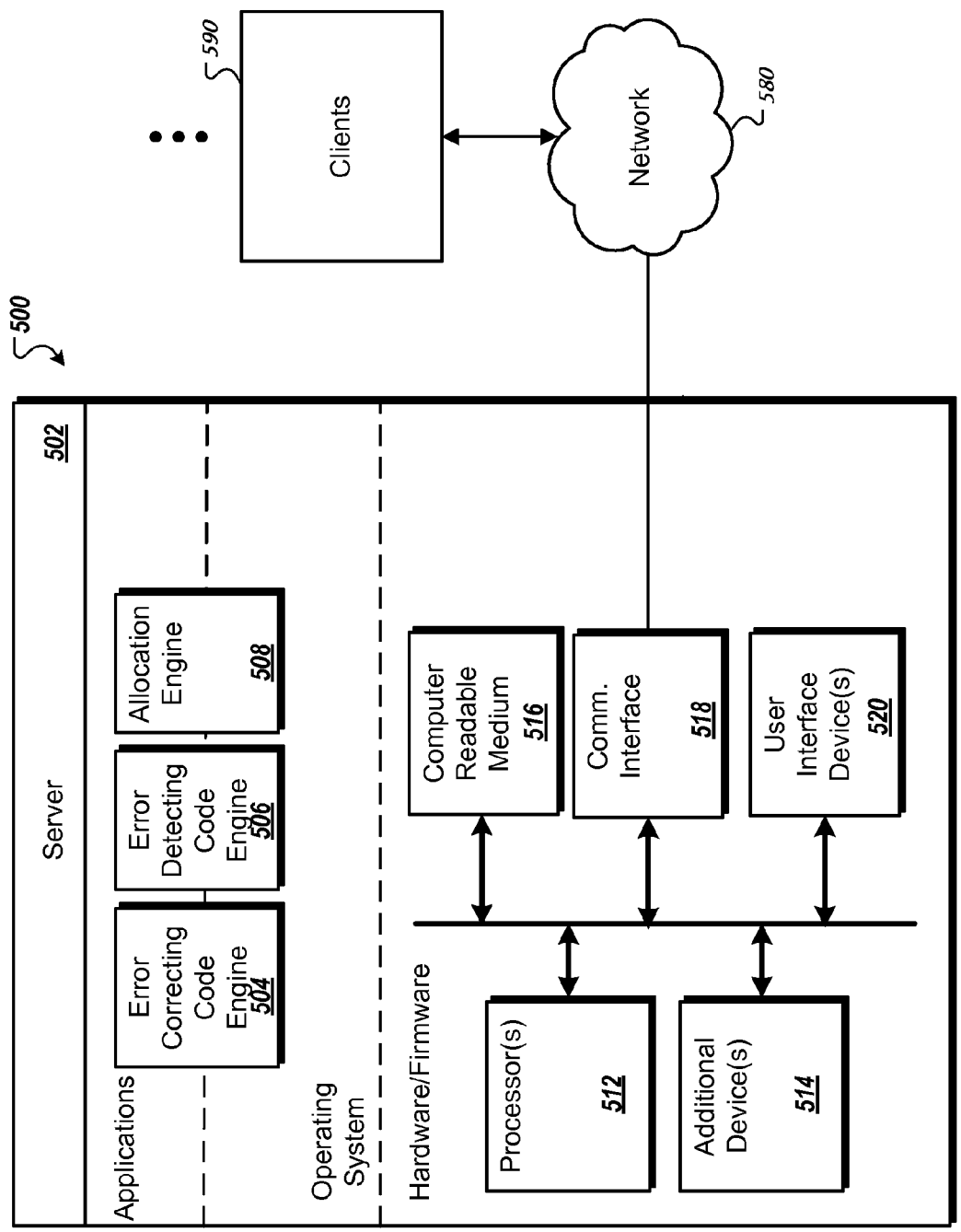
FIG. 5 is a schematic diagram of an example system configured for data storage, access, and maintenance.

FIG. 5 is a schematic diagram of an example system configured for data storage, access, and maintenance. The system generally consists of a server 502. The server 502 is optionally connected to one or more user or client computers 590 through a network 580. The server 502 consists of one or more data processing apparatus. While only one data processing apparatus is shown in FIG. 9, multiple data processing apparatus can be used. The server 502 includes various modules, e.g. executable software programs, including an error correcting code engine 504 for generating code chunks and reconstructing damaged chunks. An error-detecting code engine 506 is configured to identify damaged chunks of data. An allocation engine 508 allocates code chunks and data chunks between one or more groups of storage nodes.

Each module runs as part of the operating system on the server 502, runs as an application on the server 502, or runs as part of the operating system and part of an application on the server 502, for instance. Although several software modules are illustrated, there may be fewer or more software modules. Moreover, the software modules can be distributed on one or more data processing apparatus connected by one or more networks or other suitable communication mediums.

The server 502 also includes hardware or firmware devices including one or more processors 512, one or more additional devices 514, a computer readable medium 516, a communication interface 518, and optionally one or more user interface devices 520. Each processor 512 is capable of processing instructions for execution within the server 502. In some implementations, the processor 512 is a single or multi-threaded processor. Each processor 512 is capable of processing instructions stored on the computer readable medium 516 or on a storage device such as one of the additional devices 514. The server 502 uses its communication interface 518 to communicate with one or more computers 590, for example, over a network 580.

In some implementations, the server 502 does not have any user interface devices. In other implementations, the server 502 includes one or more user interface devices. Examples of user interface devices 520 include a display, a camera, a speaker, a microphone, a tactile feedback device, a keyboard, and a mouse. The server 502 can store instructions that implement operations associated with the modules described above, for example, on the computer readable medium 516 or one or more additional devices 514, for example, one or more of a floppy disk device, a hard disk device, an optical disk device, or a tape device.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method performed by one or more processors, the method comprising:
  receiving a block of data comprising m rows and n columns of data chunks;
  for each row in the block of data, generating (c-n) columns of error-correcting row code chunks using a first linear error-correcting code in systematic form and the particular row's data chunks; and
  for each column in the block of data and for each generated column, allocating the particular column and (r-m) error-correcting column code chunks for the particular column to a distinct group of storage nodes, wherein:
    the column code chunks are generated using a second linear error-correcting code in systematic form and the particular column's data chunks or row code chunks;
    each group of storage nodes is within a respective different data center in a different geographic location;
    allocating each column of chunks comprises allocating a first column of chunks to a first data center and each chunk of the first column of chunks to a distinct storage node of the first data center, and allocating a second column of chunks to a second data center;
    m and n are greater than one; and
    c is greater than n and r is greater than m.

2. The method of claim 1, wherein the first linear error-correcting code is distinct from the second linear error-correcting code.

3. The method of claim 1, wherein the first linear error-correcting code and the second linear error-correcting code are maximum distance separable (MDS) codes.

4. The method of claim 1, wherein each data chunk and each code chunk is stored using an error-detecting code.

5. The method of claim 1, wherein at each group of storage nodes, each of the allocated data chunks, column code chunks, and row code chunks are stored at a distinct storage node.

6. The method of claim 1, wherein a correlation of storage node failures within each group of storage nodes is higher than a correlation of failures between groups of storage nodes.

7. The method of claim 1, wherein storage nodes in a group of storage nodes use fewer resources when communicating with each other or communicate with each other with a lower latency than storage nodes in different groups of storage nodes do.

8. A method performed by one or more processors, the method comprising:
  identifying a damaged chunk at a first group of storage nodes, the first group of storage nodes storing m column data chunks and (r-m) error-correcting column code chunks based on the column data chunks, m being greater than one and r being greater than m;
  determining that the damaged chunk cannot be reconstructed without communicating with other groups of storage nodes, each other group of storage nodes storing either a row data chunk or an error-correcting row code chunk based on a row of data chunks, wherein:
    determining that the damaged chunk cannot be reconstructed without communicating with other groups of storage nodes comprises determining that a number of damaged chunks of the r chunks at the first group of storage nodes is greater than r-m; and
    each of the first group of storage nodes and other groups of storage nodes is within a respective different data center in a different geographic location;
  receiving from other groups of storage nodes a sufficient number of healthy data chunks and row code chunks for reconstruction of the damaged chunk; and
  reconstructing the damaged chunk using the received healthy data chunks and row code chunks.

9. The method of claim 8, wherein receiving from other groups of storage nodes a sufficient number of healthy data chunks and row code chunks for reconstruction of the damaged chunk comprises receiving from other groups of storage nodes all of the healthy data chunks and row code chunks corresponding to the damaged chunk's row.

10. The method of claim 8, further comprising:
  reconstructing as many other damaged chunks at the first group of storage nodes as is possible using the column code chunks and any healthy data chunks allocated to the first group of storage nodes.

11. The method of claim 9, wherein receiving from other groups of storage nodes all of the healthy data chunks and row code chunks corresponding to the damaged chunk's row comprises instructing the other groups to reconstruct as many other damaged chunks at those groups as is possible using each group's column code chunks and any healthy data chunks allocated to those groups.

12. A system comprising:
  one or more processors configured to interact with a computer storage medium in order to perform operations comprising:
    receiving a block of data comprising m rows and n columns of data chunks;
    for each row in the block of data, generating (c-n) columns of error-correcting row code chunks using a first linear error-correcting code in systematic form and the particular row's data chunks; and
    for each column in the block of data and for each generated column, allocating the particular column and (r-m) error-correcting column code chunks for the particular column to a distinct group of storage nodes, wherein:
      the column code chunks are generated using a second linear error-correcting code in systematic form and the particular column's data chunks or row code chunks;
      each group of storage nodes is within a respective different data center in a different geographic location;
      allocating each column of chunks comprises allocating a first column of chunks to a first data center and each chunk of the first column of chunks to a distinct storage node of the first data center, and allocating a second column of chunks to a second data center;
      m and n are greater than one; and
      c is greater than n and r is greater than m.

13. The system of claim 12, wherein the first linear error-correcting code is distinct from the second linear error-correcting code.

14. The system of claim 12, wherein the first linear error-correcting code and the second linear error-correcting code are maximum distance separable (MDS) codes.

15. The system of claim 12, wherein each data chunk and each code chunk is stored using an error-detecting code so that damaged chunks can be identified.

16. The system of claim 12, wherein at each group of storage nodes, each of the allocated data chunks, column code chunks, and row code chunks are stored at a distinct storage node.

17. The system of claim 12, wherein a correlation of storage node failures within each group of storage nodes is higher than a correlation of failures between groups of storage nodes.

18. The system of claim 12, wherein communication between storage nodes at a group uses fewer resources or has a lower latency than communication between groups of storage nodes.

19. A system comprising:
one or more processors configured to interact with a computer storage medium in order to perform operations comprising:
identifying a damaged chunk at a first group of storage nodes, the first group of storage nodes storing m column data chunks and (r-m) error-correcting column code chunks based on the column data chunks, m being greater than one and r being greater than m;
determining that the damaged chunk cannot be reconstructed without communicating with other groups of storage nodes, each other group of storage nodes storing either a row data chunk or an error-correcting row code chunk based on a row of data chunks, wherein:
determining that the damaged chunk cannot be reconstructed without communicating with other groups of storage nodes comprises determining that a number of damaged chunks of the r chunks at the first group of storage nodes is greater than r-m; and
each of the first group of storage nodes and other groups of storage nodes is within a respective different data center in a different geographic location;
receiving from other groups of storage nodes a sufficient number of healthy data chunks and row code chunks for reconstruction of the damaged chunk; and
reconstructing the damaged data chunk using the received healthy data chunks and row code chunks.

20. The system of claim 19, wherein receiving from other groups of storage nodes a sufficient number of healthy data chunks and row code chunks for reconstruction of the damaged chunk comprises receiving from other groups of storage nodes all of the healthy data chunks and row code chunks corresponding to the damaged chunk's row.

21. The system of claim 19, the operations further comprising:
reconstructing as many other damaged chunks at the first group of storage nodes as is possible using the column code chunks and any healthy data chunks allocated to the first group of storage nodes.

22. The system of claim 20, wherein receiving from other groups of storage nodes all of the healthy data chunks and row code chunks corresponding to the damaged chunk's row comprises instructing the other groups to reconstruct as many other damaged chunks at those groups as is possible using each group's column code chunks and any healthy data chunks allocated to those groups.

23. A computer storage medium encoded with a computer program, the program comprising instructions that when executed by data processing apparatus cause the data processing apparatus to perform operations comprising:
receiving a block of data comprising m rows and n columns of data chunks;
for each row in the block of data, generating (c-n) columns of error-correcting row code chunks using a first linear error-correcting code in systematic form and the particular row's data chunks; and
for each column in the block of data and for each generated column, allocating the particular column and (r-m) error-correcting column code chunks for the particular column to a distinct group of storage nodes, wherein:
the column code chunks are generated using a second linear error-correcting code in systematic form and the particular column's data chunks or row code chunks;
each group of storage nodes is within a respective different data center in a different geographic location;
allocating each column of chunks comprises allocating a first column of chunks to a first data center and each chunk of the first column of chunks to a distinct storage node of the first data center, and allocating a second column of chunks to a second data center;
m and n are greater than one; and
c is greater than n and r is greater than m.

24. A computer storage medium encoded with a computer program, the program comprising instructions that when executed by data processing apparatus cause the data processing apparatus to perform operations comprising:
identifying a damaged chunk at a first group of storage nodes, the first group of storage nodes storing m column data chunks and (r-m) error-correcting column code chunks based on the column data chunks, m being greater than one and r being greater than m;
determining that the damaged chunk cannot be reconstructed without communicating with other groups of storage nodes, each other group of storage nodes storing either a row data chunk or an error-correcting row code chunk based on a row of data chunks, wherein:
determining that the damaged chunk cannot be reconstructed without communicating with other groups of storage nodes comprises determining that a number of damaged chunks of the r chunks at the first group of storage nodes is greater than r-m; and
each of the first group of storage nodes and other groups of storage nodes is within a respective different data center in a different geographic location;
receiving from other groups of storage nodes a sufficient number of healthy data chunks and row code chunks for reconstruction of the damaged chunk; and
reconstructing the damaged chunk using the received healthy data chunks and row code chunks.

* * * * *